(12) United States Patent
Schiller

(10) Patent No.: US 8,284,971 B2
(45) Date of Patent: Oct. 9, 2012

(54) LOGARITHMIC COMPRESSION SYSTEMS AND METHODS FOR HEARING AMPLIFICATION

(75) Inventor: Peter Schiller, Coon Rapids, MN (US)

(73) Assignee: Envoy Medical Corporation, St. Paul, MN (US)

(*) Notice: Subject to any disclaimer, the term of this patent is extended or adjusted under 35 U.S.C. 154(b) by 793 days.

(21) Appl. No.: 12/275,555

(22) Filed: Nov. 21, 2008

(65) Prior Publication Data

US 2010/0128912 A1     May 27, 2010

(51) Int. Cl.
*H04R 25/00*     (2006.01)

(52) U.S. Cl. .................................. 381/321; 330/254

(58) Field of Classification Search .................. 381/321; 330/254

See application file for complete search history.

(56) References Cited

U.S. PATENT DOCUMENTS

| | | | |
|---|---|---|---|
| 3,735,149 A | 5/1973 | Tuchiya | |
| 4,035,739 A | 7/1977 | Dickopp et al. | |
| 4,170,720 A | 10/1979 | Killion | |
| 4,405,831 A | 9/1983 | Michelson | |
| 4,425,481 A | 1/1984 | Mansgold et al. | |
| 4,498,781 A | 2/1985 | Kaplit | |
| 4,506,174 A | 3/1985 | Hitt | |
| 4,517,415 A | 5/1985 | Laurence | |
| 4,583,180 A | 4/1986 | Kmetz | |
| 4,714,844 A | 12/1987 | Muto | |
| 4,720,809 A | 1/1988 | Taylor | |
| 4,748,577 A | 5/1988 | Marchant | |
| 4,833,718 A | 5/1989 | Sprague | |
| 4,837,832 A | 6/1989 | Fanshel | |
| 4,887,299 A | 12/1989 | Cummins et al. | |
| 4,922,131 A | 5/1990 | Anderson et al. | |
| 4,718,099 A | 1/1992 | Hotvet | |
| 5,131,046 A | 7/1992 | Killion et al. | |
| 5,144,675 A | 9/1992 | Killion et al. | |
| 5,365,465 A | 11/1994 | Larson | |
| 5,404,115 A | 4/1995 | Johnson | |
| 5,553,151 A * | 9/1996 | Goldberg | 381/312 |

(Continued)

FOREIGN PATENT DOCUMENTS

EP     0253612 A2     1/1988

(Continued)

OTHER PUBLICATIONS

PCT/US2009/055675 International Search Report and Written Opinion dated Dec. 14, 2009, 9 pages.

(Continued)

*Primary Examiner* — Jasmine Clark

(74) *Attorney, Agent, or Firm* — Fredrikson & Bryon, PA

(57) ABSTRACT

Embodiments of the invention provide an amplifier including a gain control circuit having a gain measurement circuit as part of a feedback loop. The gain measurement circuit generates an attenuated output signal, based on the gain of the amplifier circuit, which is used to generate a gain control signal. One amplifier includes a first attenuator enabling primary compression and a second attenuator as part of a gain measurement circuit. In some cases the attenuation factors of the first and second attenuators may be proportional or substantially the same. In some embodiments one or more output stages (e.g., differential amplifiers) are provided to generate the gain control signal based on differential combinations of an audio output, the attenuated output signal, and a primary threshold signal. A ratio of the gains of the two or more comparing amplifiers can set a primary compression ratio in some cases.

28 Claims, 11 Drawing Sheets

U.S. PATENT DOCUMENTS

| | | | |
|---|---|---|---|
| 5,687,241 A | 11/1997 | Ludvigsen | |
| 5,822,442 A | 10/1998 | Agnew et al. | |
| 5,848,171 A * | 12/1998 | Stockham et al. | 381/321 |
| 5,903,655 A | 5/1999 | Salmi et al. | |
| 5,933,360 A | 8/1999 | Larson | |
| 5,974,183 A | 10/1999 | Wilkinson | |
| 6,049,618 A | 4/2000 | Saltykov | |
| 6,198,830 B1 | 3/2001 | Holube et al. | |
| 6,400,293 B1 | 6/2002 | Richardson | |
| 6,417,730 B1 | 7/2002 | Segallis et al. | |
| 6,516,084 B2 | 2/2003 | Shepard | |
| 6,529,927 B1 | 3/2003 | Dunham | |
| 6,628,795 B1 | 9/2003 | Ludvigsen | |
| 6,868,163 B1 | 3/2005 | Goldstein | |
| 6,927,632 B2 | 8/2005 | Sjursen et al. | |
| 2007/0058828 A1 | 3/2007 | Fujii et al. | |

FOREIGN PATENT DOCUMENTS

| | | |
|---|---|---|
| EP | 0844804 A1 | 5/1998 |

OTHER PUBLICATIONS

Blesser, et al., A New Approach to Dynamic Range Compression for Audio Systems, presented at Oct. 21, 1968, 13 pages.

\* cited by examiner

LOGARITHMIC COMPRESSION SYSTEMS AND METHODS FOR HEARING AMPLIFICATION

BACKGROUND

Many practical systems operate over a wide dynamic range. Such systems include, for example, systems to monitor and control audio, atmospheric pressure, temperature, visual light intensity, automotive velocity, mechanical rotation rate, and seismic activity. Many such systems are measured or controlled by electronics. To provide a system operating over a very wide dynamic range, the electronics must possess a high degree of complexity and/or accuracy to be useful over the full operating range of interest. In general, cost of the electronics must be traded against accuracy.

Hearing amplification systems (e.g., for the hearing impaired) typically provide a desirable non-linear transfer function to logarithmically compress a large input dynamic range into a smaller output dynamic range. For analog logarithmic compression it is highly desirable that, a) the compression transfer function be highly predictable, b) the compression transfer function be highly accurate, c) the compression transfer function be operable over a wide input dynamic range, and d) the compression transfer function be electronically programmable.

For audio systems, it is further desirable to control the time rate (or time constant) at which the logarithmic compression is active. If the time constant (also known generally in the audiology field as "attack rate" and "release rate") is either too fast or too slow, distortion of the audio signal occurs. Therefore, it is desirable to implement analog logarithmic compression with a predictable and controllable time constant.

SUMMARY

Embodiments of the present invention are adapted for an audio system. More particularly, some embodiments provide an audio processor for the hearing impaired. Some embodiments of the invention provide accurate logarithmic compression of analog information (data) such that systems operating over a wide dynamic range may be measured and/or controlled with simplified electronics.

According to one aspect of the invention, a variable gain amplifier is provided. According to one embodiment, the variable gain amplifier generally includes an amplifier circuit and a gain control circuit, with the gain control circuit having at least a gain measurement circuit and a control signal generator. The amplifier circuit has a gain and receives as inputs an input signal and a gain control signal. The amplifier circuit generates and outputs an output signal based on the input signal and the gain control signal. The gain control circuit generally receives the amplifier circuit output signal and generates and outputs the gain control signal for controlling the gain of the amplifier circuit. In some embodiments, the gain control circuit includes a gain measurement circuit that receives as inputs the amplifier circuit output signal and the gain control signal and generates and outputs an attenuated output signal based on the gain of the amplifier circuit. The gain control circuit also includes a control signal generator that receives the amplifier circuit output signal, the attenuated output signal, and a threshold signal and generates and outputs the gain control signal based on the amplifier circuit output signal, the attenuated output signal, and the threshold signal.

In some embodiments, the amplifier circuit comprises a first attenuator characterized by a first attenuation factor which is controlled by the gain control signal. In further embodiments, the gain measurement circuit may include a second attenuator characterized by a second attenuation factor which is also controlled by the gain control signal. In some cases the first attenuation factor is substantially the same as the second attenuation factor. At least one of the first and the second attenuators may have a nominal gain other than unity.

In some embodiments, the control signal generator includes one or more logarithmic converters. For example, in one embodiment, the control signal generator includes a first logarithmic converter that receives the amplifier circuit output signal and generates a transformed output signal proportional to a logarithm of the amplifier circuit output signal. Another logarithmic converter may be provided that receives the attenuated output signal and generates a transformed attenuated output signal proportional to a logarithm of the attenuated output signal. Further, a third logarithmic converter may be included that receives the threshold signal and generates a transformed threshold signal proportional to a logarithm of the threshold signal.

In some embodiments, the control signal generator sets a compression ratio and generates the gain control signal based on the compression ratio to compress the amplifier circuit output. In some cases the control signal generator includes one or more comparing amplifiers (e.g., differential or transconductance amplifiers) that generate the gain control signal based on the amplifier circuit output signal, the attenuated output signal, and the threshold signal. A ratio of the gains of the two or more comparing amplifiers can set the compression ratio.

Further, in some embodiments, the gain control circuit includes a rectifier that rectifies the amplifier circuit output signal before the amplifier circuit output signal is received by the gain measurement circuit and the control signal generator.

According to another aspect of the invention, a hearing assistance device is provided, including, for example, an input transducer, an output transducer, an audio amplifier and a gain control circuit. The audio amplifier includes a gain, a gain control input, an input coupled to the input transducer and an output coupled to the output transducer. In general, the audio amplifier generates an audio output signal on its output based on an input signal and the audio amplifier gain. The gain control circuit may further include a gain measurement circuit and a control signal generator that generates a gain control signal. The gain measurement circuit in some embodiments includes an input coupled to the audio amplifier output, an output, and a control input. The gain measurement circuit is adapted to generate an attenuated output signal that is based on the audio amplifier gain. In some embodiments, the control signal generator includes a first input coupled to the audio amplifier output, a second input coupled to the gain measurement circuit output, a third input coupled to a threshold signal, and an output coupled to the audio amplifier gain control input and the gain measurement circuit control input. The control signal generator generates and outputs a gain control signal based on the threshold signal, the audio output signal and the attenuated output signal.

According to yet another aspect of the invention, a method of controlling a gain of an audio processing system is provided. The method is generally directed to receiving an audio input signal and a gain control signal and generating an audio output signal based on the audio input signal and the gain control signal. The method further includes receiving the audio output signal and generating an attenuated output signal. The attenuated output signal may be based on a gain of the audio processing system. The method further includes receiving the audio output signal, the attenuated output signal, and a threshold reference signal and generating the gain control signal based on the audio output signal, the attenuated output signal, and the threshold reference signal.

In some embodiments, the method includes compressing the audio output signal by reducing the gain of the audio processing system to generate the audio output signal. The attenuated output signal may be generated by reducing the audio output signal, in some cases, proportionately to the reducing the gain of the audio processing system. Further, in some embodiments, the method includes receiving the gain control signal and generating the attenuated output signal based on the gain control signal.

According to another aspect of the invention, a variable gain amplifier including an amplifier circuit and a gain control circuit is provided. The amplifier circuit receives as inputs an input signal and a gain control signal for adjusting a gain of the amplifier circuit. The amplifier circuit further generates an output signal based on the input signal and the gain control signal. In some embodiments the gain control circuit receives as an input the amplifier circuit output signal and generates the gain control signal for controlling the amplifier circuit. In some cases the gain control circuit includes a first output stage that generates a first output signal as a function of the gain of the amplifier circuit. The gain control signal may be based at least partially on the first output signal.

In some embodiments, the variable gain amplifier further includes a second output stage and/or a third output stage. The second output stage generates a second output signal proportional to a difference between the amplifier circuit output signal and a threshold signal, while the third output stage generates a third output signal proportional to the difference between the amplifier circuit output signal and the threshold signal. A summing circuit coupled to the first, the second, and the third output stages generates the gain control signal based on the first, second, and third output signals.

In some embodiments, at least one of the first, second, and third output stages may include a differential amplifier, for example, a transconductance amplifier receiving first and second inputs and generating an output current proportional to a difference in the first and the second inputs.

In some cases, the gain control signal is proportional to a gain error determined at least partially according to the relationship $$\log(ERR) = \log(OUT) - \log(THP) - \frac{1}{R}[\log(ATT)] - \frac{1}{R}[\log(OUT) - \log(THP)]$$

wherein ERR is the gain error, OUT is a magnitude of the amplifier circuit output signal, ATT is an attenuation factor contributing to at least part of the gain of the amplifier circuit, THP is the threshold signal, and R is a primary compression ratio. The expression $$\frac{1}{R}[\log(ATT)]$$

can at least partially describes the first output signal, the expression [log(OUT)−log(THP)] may at least partially describes the second output signal, and the expression $$\frac{1}{R}[\log(OUT) - \log(THP)]$$

can at least partially describes the third output signal.

In some cases each of the first, second, and third output stages have a respective gain. A ratio of gains of two of the first, second, and third output stages can set a compression ratio for the amplifier circuit. In some embodiments, a ratio of the gains of the first output stage and the second output stage set the compression ratio. The gains of the second output stage and the third output stage are substantially the same in some embodiments.

DETAILED DESCRIPTION OF THE PREFERRED EMBODIMENTS

Figure 1:
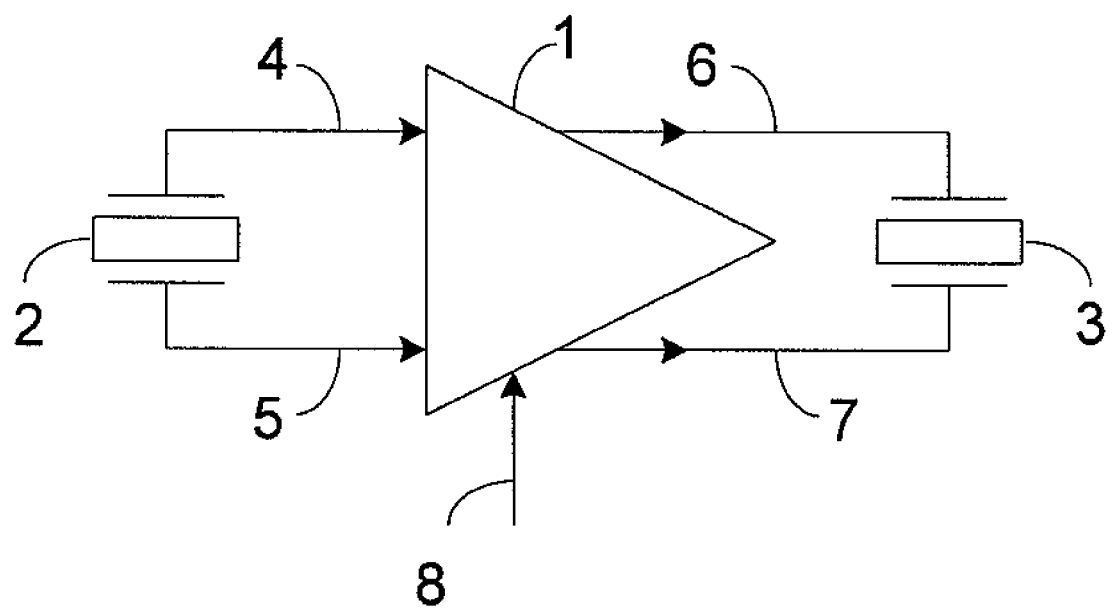
FIG. 1 is a high-level schematic of an audio processing system according to an embodiment of the invention.

The following detailed description should be read with reference to the drawings, in which like elements in different drawings are numbered identically. It will be understood that embodiments shown in the drawings and described herein are merely for illustrative purposes and are not intended to limit the invention to any embodiment. On the contrary, it is intended to cover alternatives, modifications, and equivalents as may be included within the scope of the invention as defined by the appended claims.

FIG. 1 is a top-level diagram of a general audio processing system according to some embodiments of the invention. The audio processing system includes an audio amplifier 1 (e.g., a variable gain amplifier), an input transducer 2, and an output transducer 3. The input transducer is electrically coupled to the audio amplifier 1 at input signal nodes 4 and 5. The output transducer is electrically coupled to the audio amplifier 1 at output signal nodes 6 and 7. In operation, the input transducer generates an input electrical signal on input node(s) 4 and/or 5 in response to an input audio stimulus. The output transducer generates an output audio stimulus in response to the output electrical signal on output node(s) 6 and/or 7. The audio amplifier processes the input electrical signal on the input nodes and generates the output electrical signal on output node(s) 6 and/or 7. The relationship between the output electrical signal and the input electrical signal includes a gain function of the audio amplifier. Additional input signals 8 may be delivered to the audio amplifier to affect its gain function.

The input transducer 2 may be implemented using a variety of transducers, including piezoelectric sensors, capacitive microphones, condenser microphones, electret microphones, and the like. The invention does not require a particular type of input transducer for implementation. Similarly, a wide variety of output transducers are available to implement the output transducer 3, including piezoelectric actuators, electro-magnetic speakers, and crystal speakers. The choice of output transducer will vary depending upon a particular implementation of the invention, and is not limited to any specific transducer.

The gain function of the audio amplifier generally includes a power level increase from input electrical signal to output electrical signal. The power increase may include higher voltage and/or current levels. The gain function can also include a variation with frequency. In some embodiments, the gain function may also include compression.

Figure 2:
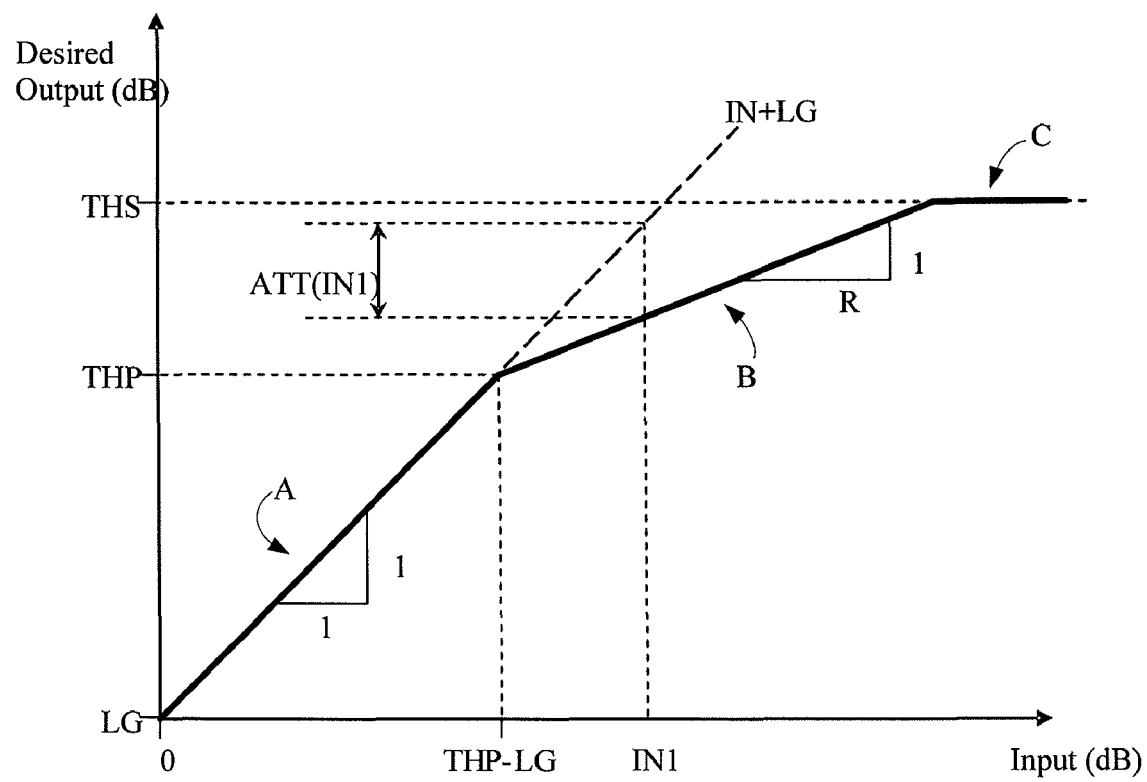
FIG. 2 is a plot of a gain function of the audio processing system of FIG. 1.

FIG. 2 is a plot of a gain function of the audio processing system of FIG. 1 according to some embodiments of the invention. The gain function includes both primary and secondary compression. The plot in FIG. 2 charts output signal amplitude versus input signal amplitude on logarithmic scales (i.e., decibels, dB). At low input levels (region A), the gain function is linear; the output signal amplitude is proportional to the input signal amplitude with proportionality constant LG. On logarithmic axes (or when plotted in dB), the slope of output signal amplitude versus input signal amplitude is unity. Region A is the linear gain region.

At moderate input levels (region B of FIG. 2), primary compression is used to achieve a non-linear gain function. In region B of FIG. 2, the output signal amplitude continues to increase as the input signal amplitude increases. However, the gain is not constant as in region A. In the embodiment shown, on logarithmic axes (or when plotted in dB), the slope of the output signal amplitude versus the input signal amplitude in region B is 1/R, where R is the primary compression ratio. Primary compression dynamically adjusts the gain (LG in region A) to achieve the desired gain function. The crossover point from region A to region B occurs at a primary compression threshold, THP. The primary compression threshold may be input-referred (THP-LG) or output-referred (THP) as shown in FIG. 2.

At higher input levels (region C of FIG. 2), secondary compression can be used to limit the output signal amplitude from exceeding a secondary compression threshold, THS. The secondary compression threshold is usually (but not always) referred to the output signal. Secondary compression is usually included in an audio system for the purposes of a) limiting maximum audio output of the system for safety or comfort, and b) preventing distortion that may occur when output signal levels exceed limits of the available power source. Those skilled in the art will appreciate that a variety of approaches may be used to provide secondary compression. Embodiments of the invention are not limited to any particular secondary compression configuration.

Figure 3:
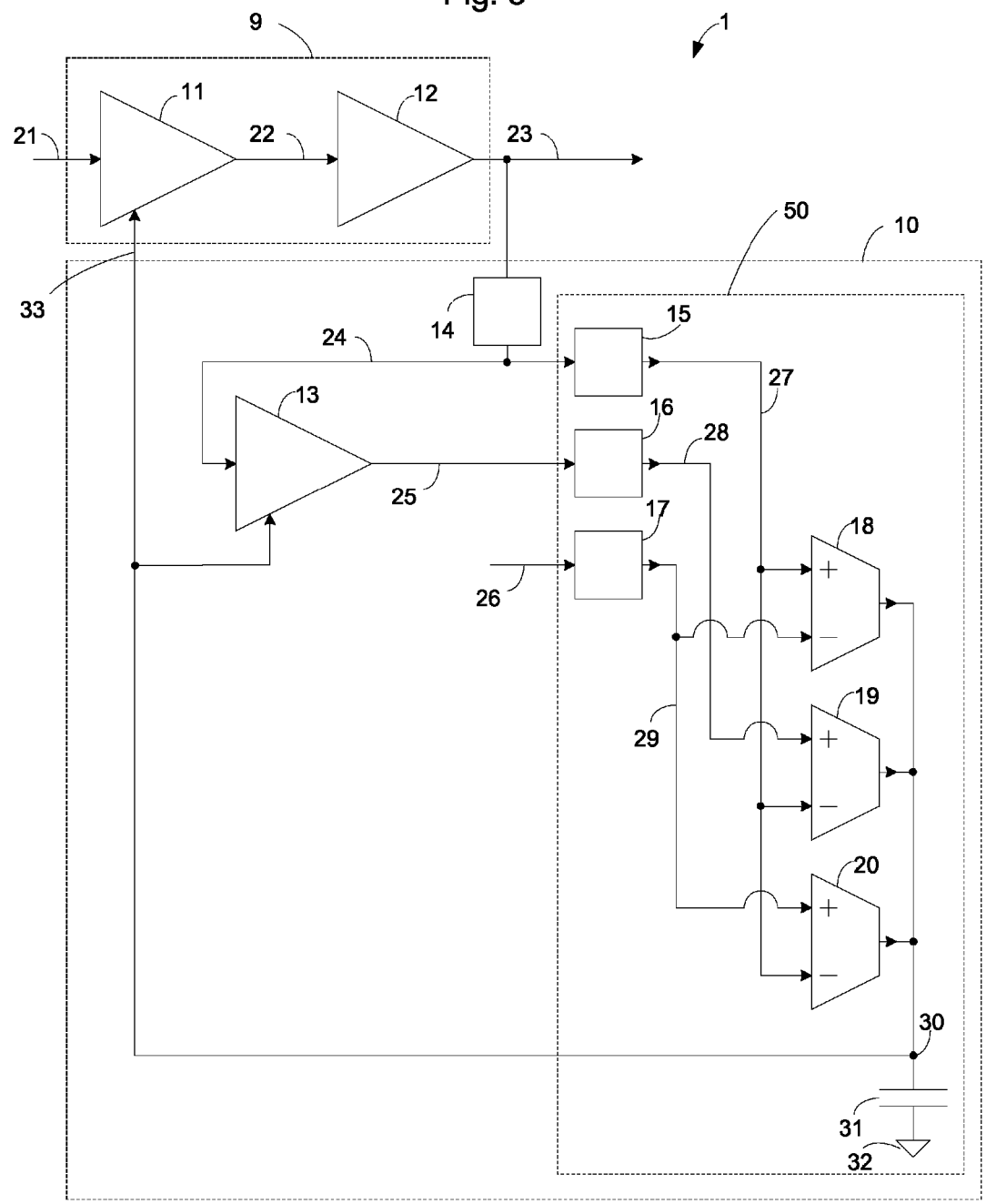
FIG. 3 is a high-level schematic of a variable gain amplifier according to an embodiment of the invention.

FIG. 3 is a high-level, functional block diagram of the audio amplifier 1 according to some embodiments of the invention. In this embodiment, the audio amplifier generally includes a variable gain amplifier system or circuit 9, which receives an audio input electrical signal 21 and processes the signal to generate an audio output electrical signal 23. FIG. 3 illustrates a single-ended implementation of an audio amplifier (in which all electrical signals are relative to a common reference signal 32), as opposed to the differential implementation illustrated in FIG. 1. The decision to implement a single-ended system versus a differential-signal application will depend upon a particular application. It is not an object of this invention and is not intended to limit or affect the scope of the invention.

The amplifier 1 further includes a gain control circuit 10, which generates a gain control signal 33, for controlling the gain of the amplifier stage 9. In some embodiments, the gain control circuit 10 generates the gain control signal 33 to control a gain of the amplifier 9 to provide a gain function similar to that shown in FIG. 2.

The various functional blocks of FIG. 3 are connected together at intermediary circuit nodes. In some embodiments the amplifier circuit 9 generally includes at least an attenuator 11 and an electrical amplifier 12 that cooperate to amplify and compress the audio input signal 21 in order to generate the audio output signal 23. The attenuator 11 includes a node 21 for receiving the audio input signal, a node 22 for outputting an attenuated input signal and a gain control input 33 at node 30. In some embodiments, the gain of the amplifier circuit 9 includes a master attenuation factor, $ATT_M$, of the attenuator 11, which is the ratio of the attenuated audio input signal at node 22 to the unattenuated audio input at node 21. In one particular implementation, when the gain control signal 33 on node 30 is low, the attenuated input signal at node 22 is generally equivalent to its audio input at node 21, i.e., the attenuation factor is about unity. When the gain control signal on node 30 increases, the attenuated input at node 22 is reduced, such that the attenuation factor of the master attenuator changes from about unity to less than unity. Alternatively, and depending on the specific implementation of the circuit blocks, the gain control signal may operate with opposite polarity.

The electrical amplifier 12 provides electrical gain, LG, of the attenuated input at node 22 to produce the audio output signal at node 23. In most applications, the electrical amplifier 12 includes such things as programmable gain and filter settings. The prior art provides a wealth of options for implementing the electrical amplifier 12, and the specific implementation of the electrical amplifier 12 is not limited to any specific configuration. According to embodiments of the present invention, the electrical amplifier produces an audio output 23 that is proportional to the attenuated audio input 22.

Continuing to refer to FIG. 3, in some embodiments, the gain control circuit 10 includes an attenuator 13 and a control signal generator 50. The attenuator 13 can in some cases be considered a "slave" attenuator, while the attenuator 11 in the amplifier circuit 9 can be considered a "master" attenuator. The slave attenuator 13 functions as a gain measurement circuit, which, in cooperation with the control signal generator 50, allows the gain control circuit 10 to measure the attenuation occurring in the attenuator 11 as it compresses the input audio signal 21. In past audio compression amplifiers, the actual attenuation has been difficult to measure because it can change dynamically as the input changes and as the system moves in and out of compression.

The slave attenuator 13 has a signal input at node 24, a signal output at node 25 and a gain control input at node 30. An attenuation factor, $ATT_S$, of the slave attenuator 13 is the ratio of the output at node 25 to input at node 24. In some embodiments, the attenuation factor of the slave attenuator 13 tracks the attenuation factor of the master attenuator 11. For example, $ATT_S$ may be equal to or proportional to $ATT_M$. In some embodiments, when the gain control signal 33 on node 30 is low, the slave attenuator audio output at node 25 is generally equivalent to its input at node 24, i.e., the attenuation factor is about unity, similar to the master attenuator 11. When the gain control signal 33 on node 30 increases, the slave attenuator output at node 25 is reduced, such that the attenuation factor of the slave attenuator changes from about unity to less than unity. Alternatively, and depending on the specific implementation of the circuit blocks, the gain control signal may operate with opposite polarity.

For simplicity of explanation, both the master attenuator 11 and slave attenuator 13 have been described as having a gain of about unity when the gain control signal is low. In some embodiments, the attenuators may also have different nominal gains without affecting the functional behavior of the system. In some embodiments, it is sufficient for the relative changes in gain for master and slave attenuators to coincide when the gain control signal 33 changes.

The slave attenuator 13 is electrically coupled to the output signal 23 of the amplifier circuit 9 to implement an output-referred feedback system in some embodiments. The slave attenuator 13 receives the audio output signal 23 and generates an attenuated output signal, OUTAT, on its output 25 based on its attenuation factor $ATT_S$, which in turn is based upon the attenuation factor $ATT_M$ of the master attenuator 11 and the overall gain of the amplifier circuit 9.

In general, for a pure tone signal, the audio waveform for the amplifier input 21 and output 23 may be expressed as a function of time:

$$vin(t) = VIN \cdot sin(2\pi ft) \text{ (input signal)}$$

$$vout(t) = VOUT \cdot sin(2\pi ft + \phi) \text{ (output signal)}$$

where f is the tone frequency, $\phi$ is a phase difference between input and output, and VIN and VOUT refer to signal magnitudes at a point in time. The sinusoidal relationships above are only presented to differentiate signal magnitudes (VIN, VOUT) from the instantaneous audio waveforms (vin(t), vout(t)).

In some embodiments, the slave attenuator 13 is coupled to the amplifier output 23 through a rectifier circuit 14. The rectifier circuit 14 rectifies the amplifier output 23 on its way to the slave attenuator 13. For example, the rectifier 14 may convert the audio electrical signal 23 to a rectified electrical output signal, OUT, 24 that is proportional to the amplitude (VOUT) of audio electrical signal 23. The constant of proportionality and specific implementation of the rectifier circuit 14 are not limited to any particular configuration, and there are many known methods in the prior art for rectifying an electrical signal.

The gain control signal generator 50 illustrated in FIG. 3 receives the attenuated output signal, OUTAT, 25 and generates the gain control signal 33 for the amplifier circuit 9 at least partially based on the attenuated output signal 25. In some embodiments, the control signal generator is coupled to the audio output 23 (optionally through the rectifier circuit 14) and generates the gain control signal 33 additionally based on the audio output 23 or the rectified output, OUT, 24.

In some embodiments the control signal generator 50 is also coupled to a threshold reference (not shown) from which it receives a threshold reference signal, THP, 26. The threshold reference signal 26 determines the primary compression threshold (THP in FIG. 2) for the system. In some embodiments, the threshold reference signal 26 is programmable, may be set manually by the user, or alternately, may be fixed. In some embodiments, when the rectified electrical output, OUT, 24 is less than the threshold reference signal 26, the gain control signal 33 is low and the system will be operating in the linear gain region A of FIG. 2. Conversely, when the rectified electrical output 24 is greater than the threshold reference signal 26, the gain control signal 33 is active and the system will be operating in the non-linear gain region B of FIG. 2.

In one embodiment, the gain control circuit 10 includes one or more logarithmic converters. For example, the control signal generator 50 in some cases includes three logarithmic converters 15, 16, and 17 with electrical input signals 24, 25, and 26, respectively. The three logarithmic converters 15, 16, and 17 generate electrical output signals 27, 28, and 29, respectively. The signals 27-29 are proportional to the logarithm of the signals 24-26, respectively; that is, signal 27 is proportional to the logarithm of OUT, signal 24, signal 28 is proportional to the logarithm of OUTAT, signal 25, and signal 29 is proportional to the logarithm of THP, signal 26. Those skilled in the art will recognize that there are several options for implementing the logarithmic converters. For example, diode voltage is logarithmically related to diode current, and MOSFET weak inversion gate voltage is logarithmically related to drain current. The implementation of the logarithmic conversion is not limited to any specific configuration.

The logarithmic converters can facilitate the generation of the gain control signal 33 by transforming one or more signals into the logarithmic domain for processing. In some embodiments, for one or more of the regions of operation (e.g., A, B, and/or C) illustrated in FIG. 2, the gain control circuit 10 may determine the desired audio output, or target, TGT, for the amplifier circuit 9 based on the magnitude of the audio input signal, IN, the primary compression threshold, THP, the linear gain of the electrical amplifier 12, LG, and/or a secondary compression threshold, THS. The system may then generate the gain control signal 33 based on a logarithmic transformation of the desired target.

For example, in one embodiment, the linear expression and logarithmic expression of the target for each operating region are as follows:

Linear Gain in region A:

Linear expression: $TGT = IN * LG$ [1]

Logarithmic expression: $\log(TGT) = \log(IN) + \log(LG)$ [2]

Non-Linear Gain in region B:

Linear expression: $TGT = THP * \left[\dfrac{LG * IN}{THP}\right]^{1/R}$ [3]

Logarithmic expression:

$\log(TGT) = \log(THP) + \left[\dfrac{1}{R}\right][\log(LG) + \log(IN) - \log(THP)]$ [4]

Compressed Output in region C:

Linear expression: $TGT = THS$ [5]

Logarithmic expression: $\log(TGT) = \log(THS)$ [6]

By comparing the desired target TGT with the output OUT, a gain error ERR, can be defined as:

Linear expression: $ERR = \dfrac{OUT}{TGT}$ [7]

Logarithmic expression: $\log(ERR) = \log(OUT) - \log(TGT)$ [8]

Logarithmic expression: $\log(ERR) = \log(OUT) - \log(TGT)$ [8]

In some cases, the gain control signal 33 may be the same as or proportional to the gain error, ERR, or the logarithm of the gain error, log(ERR).

In some embodiments, the gain control circuit 10 may provide control of the amplifier circuit 9 throughout regions A (linear gain), B (primary compression), and/or C (secondary compression). In some cases, however, the output of the amplifier in one or more of the regions may be controlled by separate circuitry. For example, in some embodiments of the invention, separate secondary compression circuitry determines when the amplifier should enter secondary compression or the "C" operating region shown in FIG. 2.

In some cases, the gain error may be determined based on the magnitude, IN, of the audio input signal 21 and/or the gain LG of the electrical amplifier 12. However, measurements of IN and LG can be difficult and prone to error. Thus, in some embodiments of the invention, the gain error may be determined apart from the input magnitude, IN, and the gain LG. For example, for the primary compression region of operation, an expression of the master attenuation factor, $$\text{Linear expression: } ATT_M = \frac{LG * IN}{OUT} \quad [9]$$

$$\text{Logarithmic expression: } \log(ATT_M) = \log(LG) + \log(IN) - \log(OUT) \quad [10]$$

may be combined with the expressions for the gain error and target output in region B given in equations [8] and [4] to provide an expression of the gain error independent of the input magnitude and the linear gain LG:

$$\log(ERR) = \quad [11]$$
$$\log(OUT) - \log(THP) - \frac{1}{R}[\log(ATT_M)] - \frac{1}{R}[\log(OUT) - \log(THP)].$$

In equation [11], parameters on the right hand side except $ATT_M$ are relatively easy to measure; both OUT and THP are referred to the output so they are minimally impacted by circuit offsets and gain errors. The actual attenuation ($ATT_M$) is difficult to measure directly because it changes dynamically as the input changes and as the system moves in and out of compression. Lack of knowledge of the $ATT_M$ at any given moment in time is an example of one limitation of prior art designs. Among other advantages, embodiments of the invention address this limitation by incorporating a gain measurement circuit, such as the slave attenuator 13, as previously mentioned above.

For example, referring again to FIG. 3, in some embodiments a method for directly measuring the actual attenuation of the amplifier circuit includes using the slave attenuator circuit 13 having an attenuation factor $ATT_S$ that is matched to the master attenuator circuit 11. In this case, the slave attenuator 13 attenuates the rectified output signal 24 to generate the attenuated rectified output 25, OUTAT. For example, the slave attenuation factor may be given as $$\text{Linear expression: } ATT_S = \frac{OUT}{OUTAT} \quad [12a]$$

$$\text{Logarithmic expression: } \log(ATT_S) = \log(OUT) - \log(OUTAT) \quad [12b]$$

In some embodiments, the slave attenuation factor $ATT_S$ may be substantially the same as or, alternately, proportional to the master attenuation factor $ATT_M$. For example, by setting $ATT_S$ equal to $ATT_M$, the attenuated rectified output, OUTAT 25, is generated by the slave attenuator 13 and in this case provides a direct measurement of the instantaneous attenuation as:

$$\text{Linear expression: } ATT_M = ATT_S = \frac{OUT}{OUTAT} \quad [13a]$$

$$\text{Logarithmic expression: } \log(ATT_M) = \log(OUT) - \log(OUTAT) \quad [13b]$$

The gain error can then be determined independently of the master attenuation factor by combining Equations 11 and 13b:

$$\log(ERR) = [\log(OUT) - \log(THP)] + \quad [14]$$
$$\frac{1}{R}[\log(OUTAT) - \log(OUT)] + \frac{1}{R}[\log(THP) - \log(OUT)]$$

Returning to FIG. 3, the depicted embodiment of the invention allows each of the terms in equation 14 to be directly measured with a high degree of accuracy and immunity to practical circuit offsets and error effects. As shown, the logarithm of the rectified output, log(OUT), is available at node 27, the logarithm of the attenuated output, log(OUTAT), is available at node 28, and the logarithm of the threshold reference signal, log(THP), is available at node 29.

In some embodiments of the invention, the gain error can be determined using equation [14] by individually determining one or more of the three differential terms in equation [14]. For example, in some embodiments, the control signal generator 50 includes one or more output stages comprising a comparing or differential amplifier. With reference to FIG. 3, in some embodiments the output stages or differential amplifiers comprise transconductance amplifiers 18, 19, 20, one for each of the three differential terms. The use of differential signals provides an improved absolute accuracy for the system. Each transconductance amplifier has a pair of differential inputs and generates an output current that is proportional to the voltage difference at its inputs. The proportionality constant between output current and input voltage difference is the transconductance, gm. In general, the three transconductance amplifiers 18, 19, 20 will have different transconductance values.

In some embodiments of the invention, the transconductance amplifiers generate output currents as follows: Transconductance amplifier 18 generates an output current into node 30 proportional to the difference between signals 27 and 29. Transconductance amplifier 19 generates an output current into node 30 proportional to the difference between signals 28 and 27. Transconductance amplifier 20 generates an output current into node 30 proportional to the difference between signals 29 and 27. These relationships may be expressed as:

$$\text{output current of } 18 = gm18[\log(OUT) - \log(THP)] \quad [15]$$

$$\text{output current of } 19 = gm19[\log(OUTAT) - \log(OUT)] \quad [16a]$$

$$\text{output current of } 20 = gm20[\log(THP) - \log(OUT)] \quad [17a]$$

The three current outputs from transconductance amplifiers 18, 19, 20 are summed together with a summing circuit, e.g., node 30, to generate the gain control signal 33. In some embodiments, the sum of the output currents determines whether the amplifier circuit is operating in the linear region A or the primary compression region B in FIG. 2. For example, in some embodiments the master attenuator 11 may be set to turn on only upon receiving a gain control signal 33 above an activation threshold. In some cases the output current from the transconductance amplifier 18 can determine whether the gain control signal 33 has a sufficient magnitude. When the rectified output, OUT, 24 is less than the primary compression threshold, THP, 26 the output current from amplifier 18 is negative and the gain control signal 33 remains relatively low. However, when the rectified output, OUT, is greater than the primary compression threshold, THP, the output current from amplifier 18 is positive and the gain control signal 33 rises above the activation threshold magnitude to turn on the master attenuator 11. Further, when the sum of the three current outputs from transconductance amplifiers 18, 19, 20 is positive, the gain control signal 33 will increase. When the sum of the three current outputs from transconductance amplifiers 18, 19, 20 is negative, the gain control signal 33 will decrease. An integrating capacitor 31 affects the rate at which the gain control signal 33 increases or decreases.

In some embodiments of the invention, the transconductance of each of the transconductance amplifiers 18, 19, 20 may be set to determine the primary compression ratio, R. For example, in some cases gm19=gm20=gm18/R. Then the respective currents flowing out of each of the three transconductance amplifiers 18, 19, and 20 are:

$$\text{output current of } 18 = gm18[\log(OUT) - \log(THP)] \quad [15]$$

$$\text{output current of } 19 = \frac{gm18}{R}[\log(OUTAT) - \log(OUT)] \quad [16b]$$

$$\text{output current of } 20 = \frac{gm18}{R}[\log(THP) - \log(OUT)] \quad [17b]$$

According to this embodiment, the sum of the current flowing out of the three transconductance amplifiers 18, 19, and 20 into node 30 is:

$$I_{tot} = gm18[\log(OUT) - \log(THP)] + \quad [18]$$
$$\frac{gm18}{R}[\log(OUTAT) - \log(OUT)] + \frac{gm18}{R}[\log(THP) - \log(OUT)]$$

By comparing equation 18 to equation 14, it can be seen that in this embodiment, the logarithm of the gain error, log(ERR), is the same as $I_{tot}/gm18$.

Thus, the sum of the current flowing out of the three transconductance amplifiers 18, 19, and 20 can be integrated on the capacitor 31 to generate the gain control signal 33. As will be appreciated, the feedback loop generated by the gain control circuit provides for closed-loop accurate and predictable compression. In some embodiments, the time constant for the compression control loop (also known generally in the field as "attack rate" and/or "release rate") is controlled by the value of the capacitor 31 and transconductance gm18. Different time constants can be achieved by programming different transconductance values or different capacitor 31 values.

The compression threshold THP is set by the primary compression threshold reference at node 26. As described above, the primary compression threshold THP may be generated in a variety of manners, such as, for example, by forcing a programmable current through a fixed resistor, by forcing a fixed current through a programmable resistor, or many other similar methods known in the field of electronics.

In some embodiments, the compression ratio R is determined by the ratios of the transconductance values for the transconductance amplifiers 18, 19, 20. Similar to the primary compression threshold, programmable and well-matched transconductance values are readily available within the field of electronics. A method for generating the desired transconductance ratios in one embodiment will be described in greater detail with reference to FIG. 10.

Figure 4:
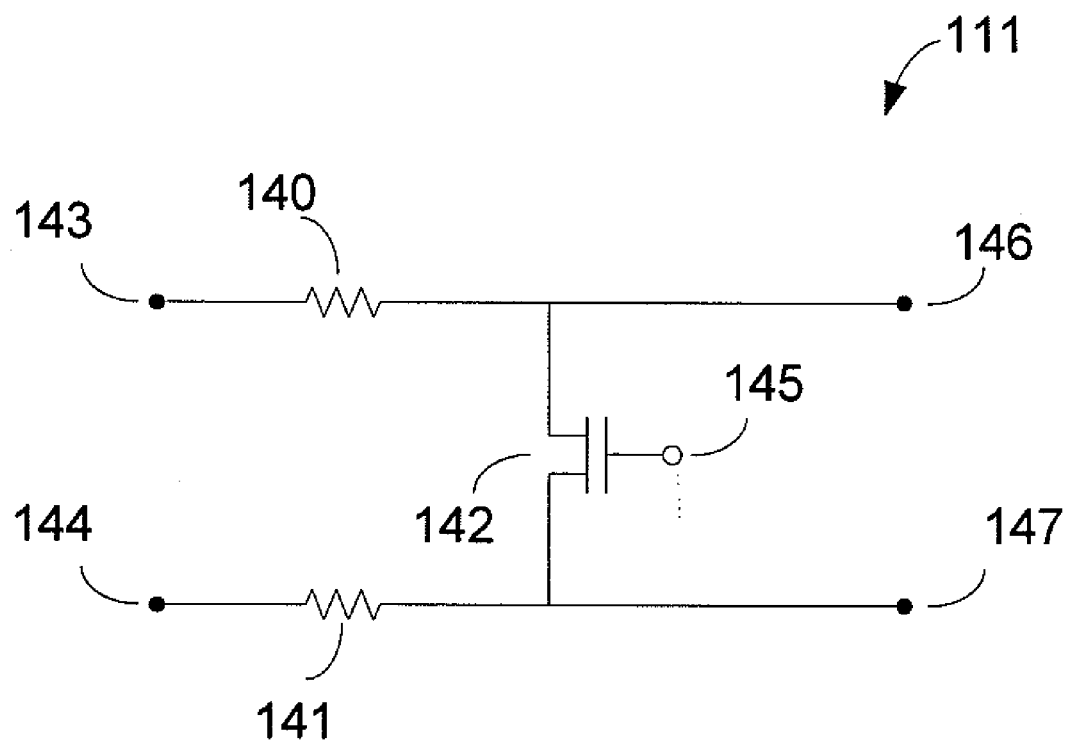
FIG. 4 is a schematic of an attenuator according to an embodiment of the invention.

Referring now to FIG. 4, one embodiment of a simple attenuator circuit 111 is shown. The attenuator receives a differential audio input signal at nodes 143 and 144, and generates a differential audio output signal at nodes 146 and 147. The attenuator further includes a pair of resistors 140 and 141 set between input and output audio signal nodes, a transistor 142 between the differential audio output signal nodes, and a gain control input signal 145. In FIG. 4, the transistor 142 is configured to be substantially OFF (non-conducting) when the input gain control signal 145 is low, and substantially ON (conducting) when the input gain control signal 145 is high. For intermediate levels of the gain control signal 145, the transistor 142 is partially conductive. In FIG. 4, when the transistor 142 is OFF, the differential audio output signal 146-147 is approximately equal to the differential audio input signal, 143-144. As the input gain control signal is increased and transistor 142 becomes partially conductive, current flows through resistors 140 and 141 and through transistor 142, so that the audio output signal 146-147 is reduced relative to audio input signal 143-144. As the input gain control signal is increased, the transistor 142 becomes increasingly conductive and the audio output signal 146-147 is further reduced (attenuated) relative to the audio input signal 143-144.

Figure 5:
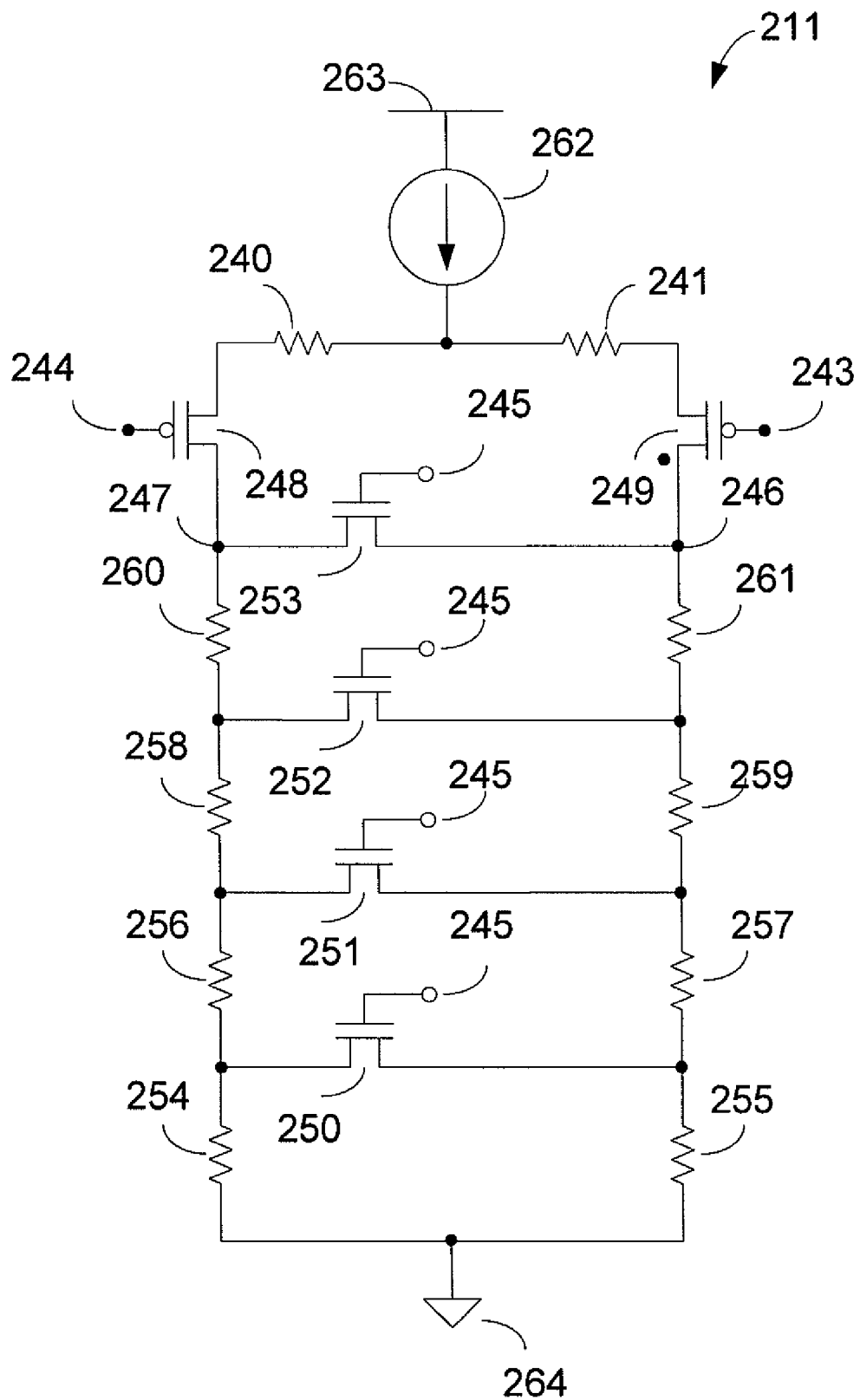
FIG. 5 is a schematic of an attenuator according to another embodiment of the invention.

In some cases, a practical limitation of the attenuator circuit in FIG. 4 is a non-linearity distortion introduced by the transistor 142. FIG. 5 shows an embodiment for another attenuator circuit 211 for a differential audio electrical signal. The attenuator circuit 211 of FIG. 5 includes a differential MOSFET pair 248-249, a pair of source degeneration resistors 240-241, a current source 262, a reference electrical level 264, a positive electrical power level 263, a series of output resistors 254-261, and a series of gain control transistors 250-253. The attenuator circuit 211 generally receives a differential audio input signal at nodes 243-244 and generates a differential audio output signal at nodes 246-247 based on a gain control input signal 245.

In some cases, the differential transistor pair 243-244 along with current source 262 employ a conventional differential amplifier. One advantage of a differential amplifier is relative immunity to power supply noise and other environmental anomalies. The source degeneration resistors 240-241 can extend the linear input range of the attenuator circuit 211, thus also reducing audio distortion. The source degeneration resistors can also reduce input-referred offsets in the circuit. In some embodiments, the source degeneration resistors 240-241 are configured such that to the extent practically possible, their impedances are substantially equal. Also, the output resistors 254-261 may be configured such that to the extent practically possible, the impedances of resistors 254-255 are substantially equal, the impedances of resistors 256-257 are substantially equal, the impedances of resistors 258-259 are substantially equal, and the impedances of resistors 260-261 are substantially equal.

Operation of the attenuation circuit in FIG. 5 is similar to the operation of the attenuator depicted in FIG. 4. As the gain control input signal is increased, the conductance of transistors 250-253 increases so that the differential audio output signal 246-247 is attenuated. The attenuator 211 includes four series output stages having an output resistor with a gain control transistor (e.g., 254, 255, and 250). In general, a higher number of output series stages can result in lower distortion, and a lower number of output series stages can lead to higher distortion.

Figure 6:
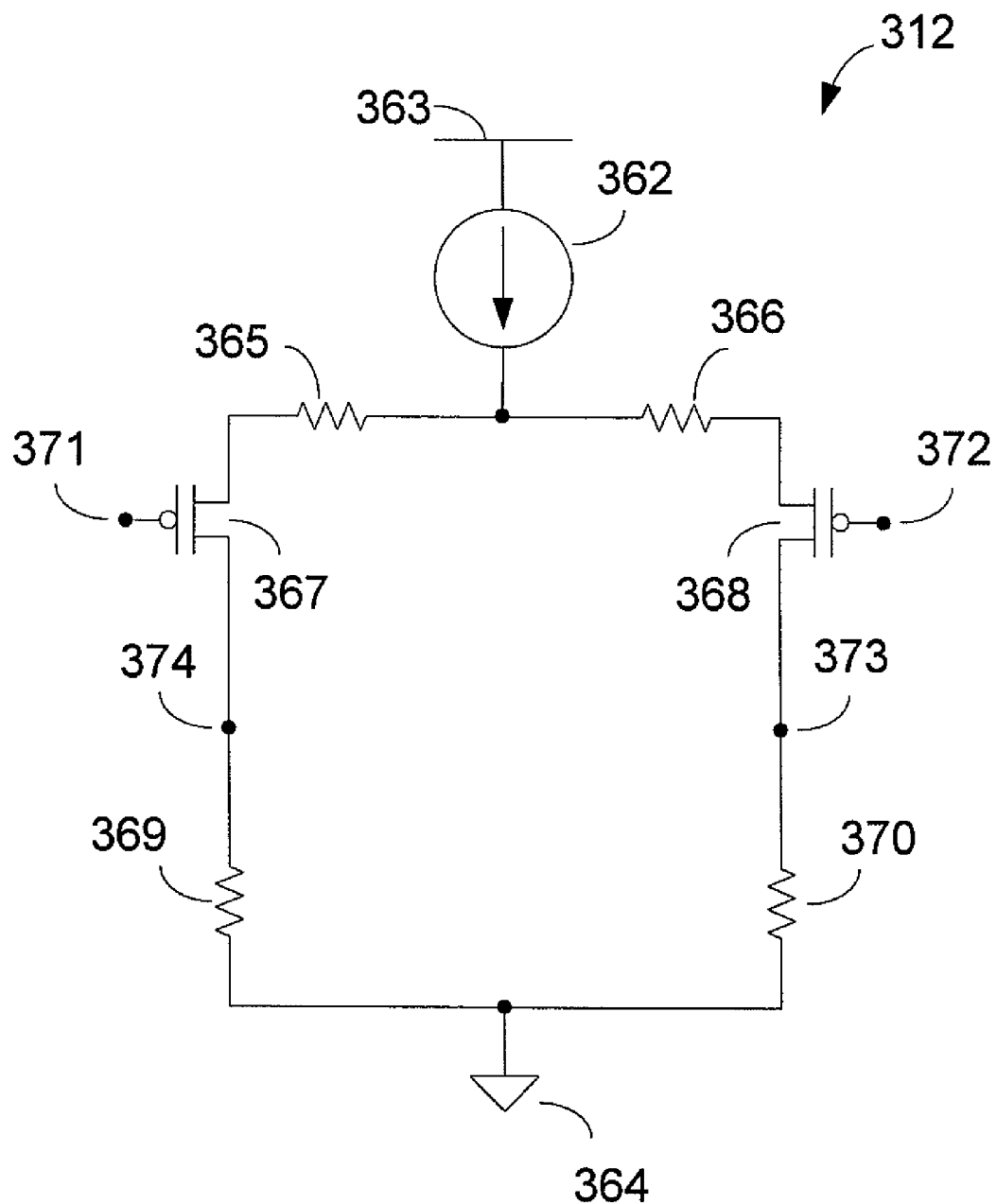
FIG. 6 is a schematic of a differential amplifier according to an embodiment of the invention.

FIG. 6 shows one embodiment for an electrical amplifier 312 for a differential audio electrical signal. The electrical amplifier circuit of FIG. 6 includes a differential MOSFET pair 367-368, a pair of source degeneration resistors 365-366, a current source 362, a reference electrical level 364, a positive electrical power level 363, and a pair of output resistors 369-370. The amplifier 312 receives a differential audio input signal at nodes 371-372 and generates a corresponding differential audio output signal at nodes 373-734. Those skilled in the art will recognize that the differential transistor pair 367-368 along with current source 362 can constitute a conventional differential amplifier. One advantage of a differential amplifier is relative immunity to power supply noise and other environmental anomalies. The source degeneration resistors 365-366 extend the linear input range of the electrical amplifier circuit 312, thus reducing audio distortion. The source degeneration resistors also reduce input-referred offsets in the circuit. In some embodiments the source degeneration resistors 365-366 and output resistors 369-370 are configured such that to the extent practically possible, their impedances are substantially equal.

Figure 7:
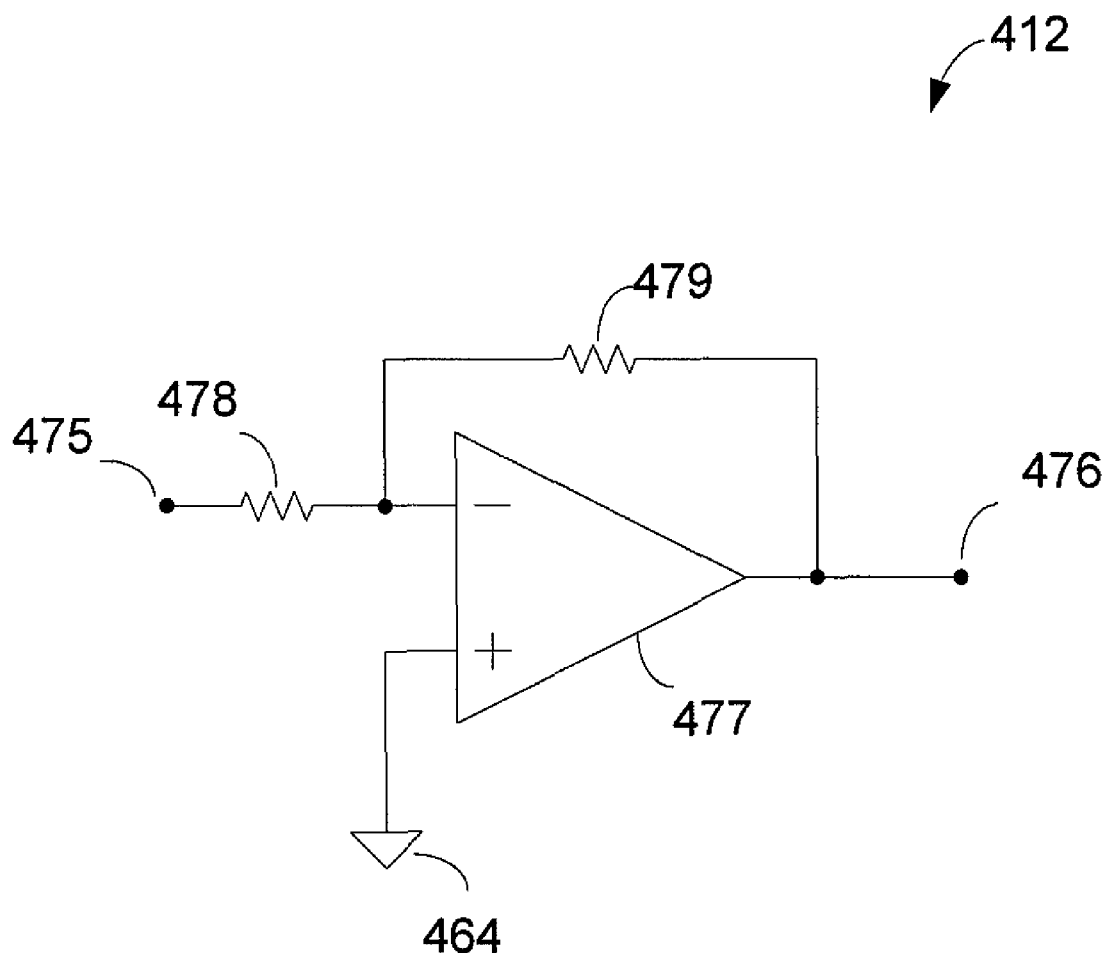
FIG. 7 is a schematic of a single-ended amplifier according to an embodiment of the invention.

Referring to FIG. 7, in some embodiments, the electrical amplifier 12 shown in FIG. 3 may be provided as a simple electrical amplifier 412 for a single-ended audio electrical signal. The electrical amplifier circuit 412 includes an operational amplifier 477, an input resistor 478, a feedback resistor 479, and a reference electrical level 464. The amplifier receives a single-ended audio input signal at node 475 and generates a corresponding single-ended audio output signal at node 476. Those skilled in the art will recognize that the amplifier 412 can be implemented as a conventional inverting amplifier based on an operational amplifier.

Figure 8:
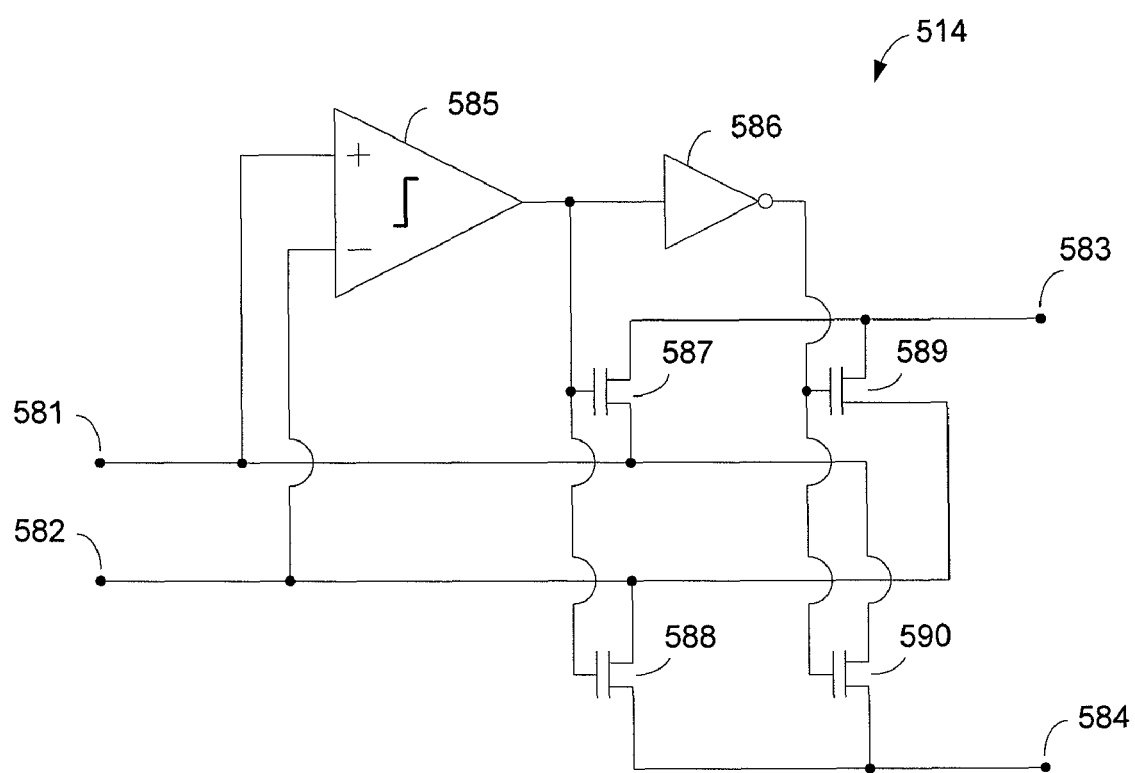
FIG. 8 is a schematic of a differential rectifier according to an embodiment of the invention.

FIG. 8 shows one embodiment for a differential rectifier 514 for a differential audio electrical signal. The differential rectifier circuit 514 includes a comparator 585, an inverter 586, four pass-gate transistors 587-590, differential audio input signal nodes 581-582, and differential rectified output signal nodes 583-584. The first audio input signal 581 is connected to the non-inverting input of the comparator 585 and the second audio input signal 582 is connected to the inverting input of the comparator 585. When the first audio input signal 581 is greater than the second audio input signal 582, the comparator 585 output goes high and inverter 586 output goes low so that pass transistors 587 and 588 are turned on and the first rectified output signal 583 is connected to first audio input signal 581 and the second rectified output signal 584 is connected to second audio input signal 582. In this case pass transistors 589 and 590 are turned off.

When the first audio input signal 581 is less than the second audio input signal 582, the comparator 585 output goes low and inverter 586 output goes high. Pass transistors 589 and 590 are then turned on so that the first rectified output signal 583 is connected to second audio input signal 582 and the second rectified output signal 584 is connected to first audio input signal 581, with pass transistors 587 and 588 turned off. In this configuration for the differential rectifier 514, the first rectified output 583 is substantially equivalent to the greater of the two audio input signals, and the second rectified output 584 is substantially equivalent to the lesser of the two audio input signals. The resulting differential rectified outputs 583 and 584 provide a measure of audio signal amplitude at differential inputs 581 and 582. Post filtering may be included to smooth the differential rectified output.

Figure 9:
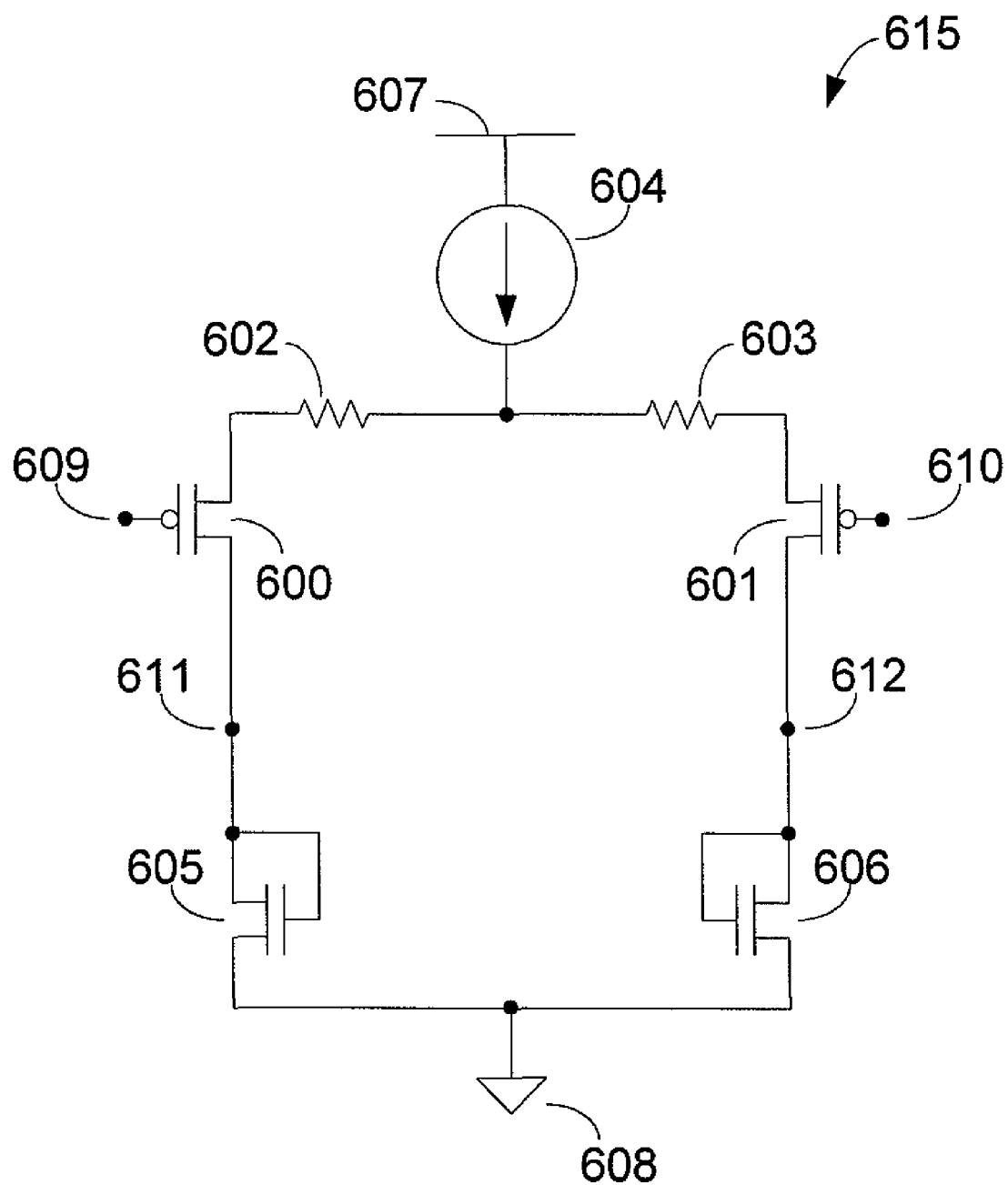
FIG. 9 is a schematic of a logarithmic converter according to an embodiment of the invention.

FIG. 9 illustrates a logarithmic converter 615 for a differential electrical signal according to some embodiments of the invention. The logarithmic converter circuit 615 includes a differential MOSFET pair 600-601, a pair of source degeneration resistors 602-603, a current source 604, a reference electrical level 608, a positive electrical power level 607, a pair of diode connected MOSFET transistors 605-606, differential input signal nodes 609-610, and differential output signal nodes 611-612. Those skilled in the art will recognize that the differential transistor pair 600-601 along with current source 604 and degeneration resistors 602-603 may be implemented as a simple linear differential transconductance amplifier. One advantage of this transconductance amplifier configuration is relative immunity to power supply noise, extended linear input range, and reduced input-referred offsets in the circuit.

In some embodiments, the source degeneration resistors 602-603 are configured such that to the extent practically possible, their impedances are substantially equal. The linear differential transconductance amplifier (600-604) generates a differential output current at nodes 611 and 612 that is proportional to the differential input signal 609-610. The differential output current at nodes 611 and 612 is forced through the diode connected MOSFET transistors 605-606. When the current source 604 and MOSFET transistors 605-606 are properly proportioned to ensure weak inversion operation, the output voltage signals at 611-612 are logarithmically dependent on the differential input signal 609-610. In some embodiments, the output voltage signals at 611-612 may be evaluated differentially or independently as single-ended signals. Furthermore, in some cases the logarithmic function may be offset (mathematically equivalent to multiplication of the differential input signal 609-610) by specifically selecting the aspect ratios of the diode connected MOSFET transistors 605-606.

Of course, the logarithmic converters in FIG. 3 may be implemented in a variety of manners, and the invention is not limited to any one embodiment or logarithmic base. In some cases, the logarithmic converters may provide a logarithmic transformation based on the natural logarithm, the base 10 logarithm, or any other logarithmic base. The use of the term "LOG" throughout the application is meant to refer to a general logarithmic function, and is not limited to any specific base.

Figure 10:
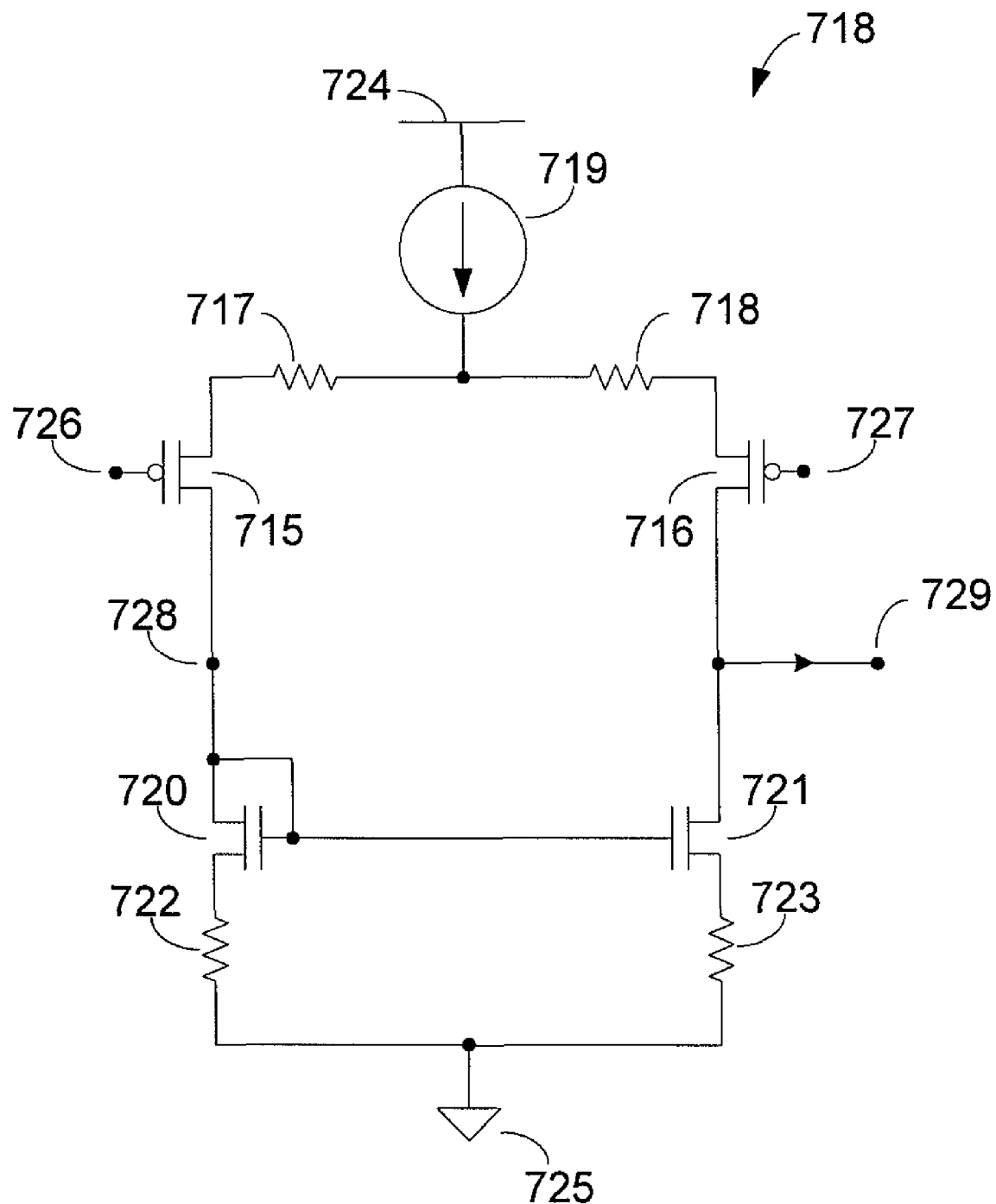
FIG. 10 is a schematic of a transconductance amplifier according to an embodiment of the invention.

FIG. 10 shows an embodiment for a transconductance amplifier 718 for a differential electrical signal. The transconductance amplifier circuit 718 includes a differential MOSFET pair 715-716, a first pair of source degeneration resistors 717-718, a second pair of source degeneration resistors 722-723, a current source 719, a reference electrical level 725, a positive electrical power level 724, a diode connected MOSFET transistor 720, an output current source MOSFET transistor 721, differential input signal nodes 726-727, and output current signal node 729. Those skilled in the art will recognize that the differential transistor pair 715-716 along with current source 719 and degeneration resistors 717-718 may be implemented as a simple linear differential transconductance amplifier. The transistor pair 720-721 along with degeneration resistors 722-723 constitutes a current mirror, such that the transconductance amplifier 718 generates an output current 729 that is proportional to the input voltage difference at nodes 726-727. Advantages of this transconductance amplifier configuration include relative immunity to power supply noise, extended linear input range, and reduced input-referred offsets in the circuit. In some embodiments, the source degeneration resistors 717-718 and resistors 722-723 are configured such that to the extent practically possible, their impedances are substantially equal, respectively. Similarly the transistor pairs may be configured such that to the extent practically possible, device 715 is substantially identical to device 716 and device 720 is substantially identical to device 721.

In this embodiment, the transconductance of the amplifier 718 is primarily determined by the resistance values of degeneration resistors 717 and 718. In this embodiment, the compression ratio is not dependent on the absolute value of these resistors (as is sometimes the case in the prior art) but rather on the ratio of the resistance values. The ratio of resistance values is typically controllable to within 0.1% accuracy, whereas the absolute values of resistance values are controllable to within only about 10% accuracy. Embodiments of the present invention can therefore be accurate over approximately a 60 dB dynamic range (0.1%=0.001=$\frac{1}{1000}$=−60 dB) compared to a conventional analog system which might achieve a 20 dB dynamic range (10%=0.10=$\frac{1}{10}$=−20 dB).

Figure 11:
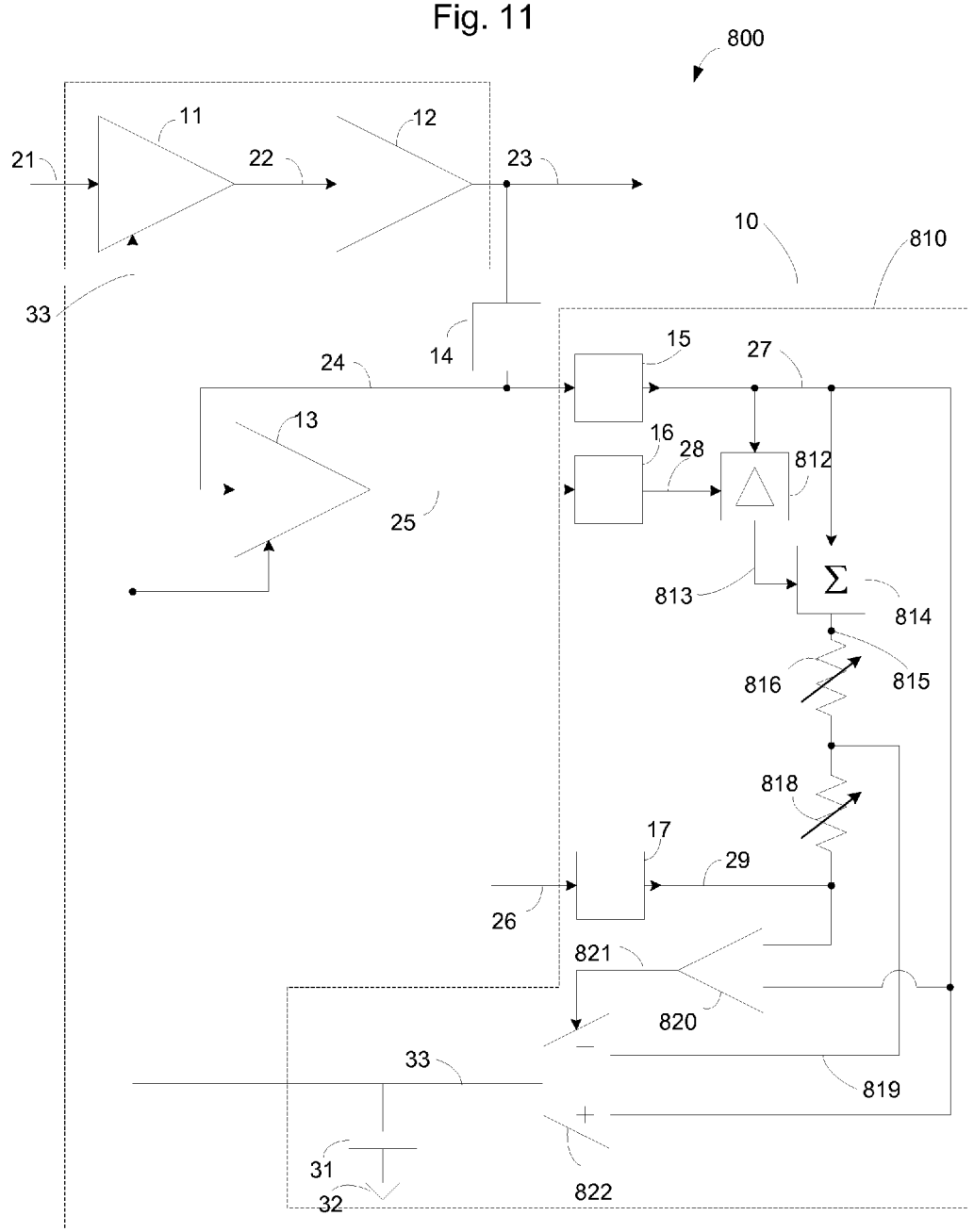
FIG. 11 is a high-level schematic of a variable gain amplifier according to an alternate embodiment of the invention.

Referring now to FIG. 11, in some embodiments of the invention, the gain error log(ERR) can be determined by directly determining the target output and comparing this with the output. For example, FIG. 11 illustrates a variable gain amplifier 800 according to an alternate embodiment. The amplifier 800 is similar in many respects to the amplifier 1 depicted in FIG. 3. However, the amplifier 800 includes a somewhat differently configured control signal generator 810 that processes the rectified output, OUT, 24, the attenuated rectified output, OUTAT, 25, and the threshold reference signal, THP, 26 to determine the corresponding desired target output, TGT, 819 to compare to the rectified output OUT.

By manipulating equations [9] and [10] described above, the logarithmic transform of the rectified output signal, log(OUT) can be expressed as:

$$\text{Linear expression: } OUT = \frac{LG * IN}{ATT_M} \quad [19]$$

$$\text{Logarithmic expression: } \log(OUT) = \log(LG) + \log(IN) - \log(ATT_M) \quad [20]$$

In some embodiments, the control signal generator 810 includes a difference operator 812 and a summing operator 814 which allow the circuit to determine the magnitude of the amplified audio input, LG*IN, based on the attenuated output signal, OUTAT 25 and the rectified output signal, OUT 24. For example, when the slave attenuation factor $ATT_S$ is set equal to the master attenuation factor $ATT_M$, equations [20] and [13b] can be used to subtract log(OUTAT) from log(OUT), the difference (signal 813) of which is then added to log(OUT) to determine log(LG*IN) at node 815 as follows:

log(OUT)−log(OUTAT)=log(OUT)−log(OUT)+log($ATT_M$)=log($ATT_M$)

log($ATT_M$)+log(OUT)=log($ATT_M$)+log(LG)+log(IN)−log($ATT_M$)=log(LG)+log(IN)

The logarithmic transform of the amplified input, log(LG)+log(IN), is then fed into a voltage divider circuit at node 815 including resistors 816 and 818. The voltage divider circuit determines the logarithmic transform of the desired target output, log(TGT) 819, based on the amplified input and the logarithmic transform 29 of the primary compression threshold, THP, 26. In some embodiments, the resistors 816, 818 are chosen to set the primary compression ratio, R, for the circuit.

The desired target output, log(TGT) 819 is then fed to a differential amplifier 822, where it is compared with log(OUT) 27 to generate the gain control signal 33. The differential amplifier 822 may comprise a transconductance amplifier, having a transconductance gm, similar to previously described embodiments. The transconductance gm combines with the capacitance of the integrating capacitor 31 to set the desired time constant (e.g., attack and release times) for the circuit. In some embodiments, the control signal generator 810 further includes an enabling comparator 820, which compares the rectified output, log(OUT) with the primary compression threshold, log(THP). For example, when the log(OUT) is greater than or equal to log(THP), the comparator 820 enables the differential amplifier 822 to operate in the compression region B of FIG. 2. When log(OUT) is less than log(THP), the comparator 820 turns the differential amplifier 822 off, thus decreasing the gain control signal 33 and disabling compression.

It will be appreciated by those skilled in the art that there are many variations of the disclosed embodiments that achieve substantially equivalent results. For example, various signal and component polarities may be reversed, and MOSFET devices may be replaced with other transistor types such as BJT and/or JFET devices. The depicted differential analog processing scheme may be replaced with single-ended to meet other application requirements.

Thus, embodiments of the LOGARITHMIC COMPRESSION SYSTEMS AND METHODS FOR HEARING AMPLIFICATION are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention.

What is claimed is:

1. A hearing assistance device, comprising:
an input transducer;
an output transducer;
an audio amplifier having a gain, a gain control input, an input coupled to the input transducer and an output coupled to the output transducer, the audio amplifier generating an audio output signal on its output based on the audio amplifier gain; and
a gain control circuit having an input coupled to the audio amplifier output and an output coupled to the audio amplifier gain control input, the gain control circuit having
a gain measurement circuit having an input coupled to the audio amplifier output, an output, and a control input, the gain measurement circuit adapted to generate an attenuated output signal based on the audio amplifier gain and
a control signal generator having a first input coupled to the audio amplifier output, a second input coupled to the gain measurement circuit output, a third input coupled to a threshold signal reference, and an output coupled to the audio amplifier gain control input and the gain measurement circuit control input, the control signal generator adapted to generate and output a gain control signal based on a threshold signal, the audio output signal and the attenuated output signal.

2. The hearing assistance device of claim 1, wherein the audio amplifier comprises a first attenuator having a first attenuation factor controlled by the gain control signal.

3. The hearing assistance device of claim 2, wherein the gain measurement circuit comprises a second attenuator having a second attenuation factor controlled by the gain control signal.

4. The hearing assistance device of claim 3, wherein the first attenuation factor is substantially the same as the second attenuation factor.

5. The hearing assistance device of claim 3, wherein at least one of the first and the second attenuators has a nominal gain other than unity.

6. The hearing assistance device of claim 1, wherein the control signal generator is adapted to set a compression ratio and generate the gain control signal based on the compression ratio to compress the amplifier circuit output.

7. The hearing assistance device of claim 6, wherein the control signal generator comprises a plurality of comparing amplifiers for generating the gain control signal based on the audio output signal, the attenuated output signal, and the threshold signal, wherein a ratio of gains of the two or more of the plurality of comparing amplifiers sets the compression ratio.

8. The hearing assistance device of claim 1, wherein the gain control circuit further comprises a rectifier adapted to rectify the audio output signal before the audio output signal is received by the gain measurement circuit and the control signal generator.

9. The hearing assistance device of claim 1, wherein the gain measurement circuit is adapted to generate the attenuated output signal using the gain control signal.

10. The hearing assistance device of claim 1, wherein the control signal generator comprises an output stage coupled to the audio amplifier output and the gain measurement circuit output, the output stage adapted to generate an output stage signal proportional to a difference between the audio output signal and the attenuated output signal, and wherein the control signal generator being adapted to generate the gain control signal based on the threshold signal, the audio output signal and the attenuated output signal comprises being adapted to generate the gain control signal based on the output stage signal.

11. A hearing assistance device, comprising:
an audio amplifier circuit receiving as inputs an input signal and a gain control signal for adjusting a gain of the audio amplifier circuit, the audio amplifier circuit generating and outputting an audio output signal based on the input signal and the gain control signal; and
a gain control circuit receiving as an input the audio output signal and generating and outputting the gain control signal for controlling the audio amplifier circuit, the gain control circuit comprising a first output stage outputting a first output signal, the gain control signal being based on at least the first output signal, and the gain control circuit generating the first output signal as a function of the gain of the audio amplifier circuit using the audio output signal and the gain control signal.

12. The hearing assistance device of claim 11, further comprising a second output stage generating a second output signal proportional to a difference between the audio output signal and a threshold signal, a third output stage generating a third output signal proportional to the difference between the audio output signal and the threshold signal, and a summing circuit coupled to the first, the second, and the third output stages and generating the gain control signal based on the first, second, and third output signals.

13. The hearing assistance device of claim 12, wherein the gain control signal is proportional to a gain error determined at least partially according to the relationship $$\log(ERR) = \log(OUT) - \log(THP) - \frac{1}{R}[\log(ATT)] - \frac{1}{R}[\log(OUT) - \log(THP)]$$

wherein ERR is the gain error, OUT is a magnitude of the audio output signal, ATT is an attenuation factor contributing to at least part of the gain of the audio amplifier circuit, THP is the threshold signal, R is a primary compression ratio, and wherein the expression $$\frac{1}{R}[\log(ATT)]$$

at least partially describes the first output signal, the expression [log(OUT)–log(THP)] at least partially describes the second output signal, and the expression $$\frac{1}{R}[\log(OUT) - \log(THP)]$$

at least partially describes the third output signal.

14. The hearing assistance device of claim 12, wherein each of the first, second, and third output stages have a respective gain, and wherein a ratio of gains of two of the first, second, and third output stages sets a compression ratio for the audio amplifier circuit.

15. The hearing assistance device of claim 14, wherein a ratio of the gains of the first output stage and the second output stage set the compression ratio and wherein the gains of the second output stage and the third output stage are substantially the same.

16. The hearing assistance device of claim 12, wherein at least one of the first, second, and third output stages of the gain control circuit comprise a differential amplifier.

17. The hearing assistance device of claim 16, wherein the differential amplifier comprises a transconductance amplifier receiving first and second inputs and generating an output current proportional to a difference in the first and the second inputs.

18. The hearing assistance device of claim 11, wherein the gain of the audio amplifier circuit comprises an attenuation factor and wherein the first output signal is a function of the attenuation factor.

19. The hearing assistance device of claim 11, wherein the audio amplifier circuit comprises a first attenuator attenuating the input signal based on the gain control signal.

20. The hearing assistance device of claim 19, wherein the gain control circuit further comprises a second attenuator receiving the output signal of the amplifier circuit and generating an attenuated output signal, wherein the first output signal is based on the attenuated output signal.

21. The hearing assistance device of claim 11, wherein the gain control circuit generates the attenuated output signal by attenuating the audio output signal using the gain control signal.

22. The hearing assistance device of claim 21, wherein the first output signal is proportional to a difference between the audio output signal and the attenuated output signal.

23. A hearing assistance device comprising:
an input transducer;
an output transducer;

an audio amplifier having a gain, a gain control input, an input coupled to the input transducer and an output coupled to the output transducer, the audio amplifier generating an audio output signal on its output based on the audio amplifier gain; and a gain control circuit having an input coupled to the audio amplifier output and an output coupled to the audio amplifier gain control input, the gain control circuit having a gain measurement circuit having an input coupled to the audio amplifier output, an output, and a control input, the gain measurement circuit adapted to generate an attenuated output signal based on the audio amplifier gain and a control signal generator comprising a first input coupled to the audio amplifier output, a second input coupled to the gain measurement circuit output, a third input coupled to a threshold signal reference, an output coupled to the audio amplifier gain control input and the gain measurement circuit control input, a first logarithmic converter adapted to receive the audio output signal and generate and output a transformed output signal proportional to a logarithm of the audio output signal, a second logarithmic converter adapted to receive the attenuated output signal and generate and output a transformed attenuated output signal proportional to a logarithm of the attenuated output signal, and a third logarithmic converter adapted to receive a threshold signal and generate and output a transformed threshold signal proportional to a logarithm of the threshold signal, the control signal generator adapted to generate and output a gain control signal based on the threshold signal, the audio output signal and the attenuated output signal.

24. The hearing assistance device of claim 23, wherein the control signal generator being adapted to generate the gain control signal based on the threshold signal, the audio output signal and the attenuated output signal comprises being adapted to generate the gain control signal based on the transformed threshold signal, the transformed output signal and the transformed attenuated output signal.

25. The hearing assistance device of claim 23, wherein the control signal generator further comprises at least one comparing amplifier coupled to the first logarithmic converter and the second logarithmic converter, wherein the at least one comparing amplifier is adapted to generate an output stage signal proportional to a difference between the transformed output signal and the transformed attenuated output signal, and wherein the control signal generator being adapted to generate the gain control signal based on the threshold signal, the audio output signal and the attenuated output signal comprises being adapted to generate the gain control signal based on the output stage signal.

26. The hearing assistance device of claim 23, wherein the audio amplifier comprises a first attenuator having a first attenuation factor controlled by the gain control signal.

27. The hearing assistance device of claim 26, wherein the gain measurement circuit comprises a second attenuator having a second attenuation factor controlled by the gain control signal.

28. The hearing assistance device of claim 23, wherein the control signal generator is adapted to set a compression ratio and generate the gain control signal based on the compression ratio to compress the amplifier circuit output, and wherein the control signal generator comprises a plurality of comparing amplifiers for generating the gain control signal based on the transformed output signal, the transformed attenuated output signal, and the transformed threshold signal, wherein a ratio of gains of the two or more of the plurality of comparing amplifiers sets the compression ratio.

* * * * *